United States Patent [19]
Sasaki et al.

[11] 3,889,193
[45] June 10, 1975

[54] AUTOMATIC FREQUENCY CONTROL CIRCUIT

[75] Inventors: Tadao Sasaki; Yasuji Kato; Toshiaki Meguro, all of Tokyo, Japan

[73] Assignee: Sony Corporation, Tokyo, Japan

[22] Filed: Jan. 16, 1974

[21] Appl. No.: 433,796

[30] Foreign Application Priority Data

Jan. 23, 1973 Japan ................................ 48-9685

[52] U.S. Cl. ................ 325/419; 325/418; 325/422; 325/469; 334/15

[51] Int. Cl. .............................................. H04b 1/16

[58] Field of Search ........................... 325/417–423; 329/192; 178/5.8 AF, 7.3 R; 334/14–16

[56] References Cited

UNITED STATES PATENTS

| | | | |
|---|---|---|---|
| 3,444,477 | 5/1969 | Avins | 178/7.3 R |
| 3,806,817 | 4/1974 | Uchida | 325/418 |
| 3,806,818 | 4/1974 | Uchiyama | 325/417 |

*Primary Examiner*—Robert L. Griffin
*Assistant Examiner*—Robert Hearn
*Attorney, Agent, or Firm*—Lewis H. Eslinger; Alvin Sinderbrand

[57] ABSTRACT

An automatic frequency control circuit having a defeating circuit for defeating an automatic frequency controlling operation of a receiver having an electronic tuning circuit for a predetermined time period after a power switch for the receiver is turned on.

1 Claim, 4 Drawing Figures

PATENTED JUN 10 1975

3,889,193

SHEET 2

AUTOMATIC FREQUENCY CONTROL CIRCUIT

BACKGROUND OF THE INVENTION

1. Field of the Invention

This invention relates generally to an automatic frequency control circuit for a turnable receiver, and more particularly to a defeating circuit for the automatic frequency control circuit.

2. Description of the Prior Art

An automatic frequency control circuit for an electronic tuning circuit has been known in the art. With the prior art automatic frequency control circuit, the tuning voltage for the electronic tuning circuit increases slowly after turning on the power switch of a receiver. This slow increase occurs because of the time constant of the tuning voltage presetting circuit. However, when the power switch is turned on, the automatic frequency control circuit starts its operation relatively quickly, so that an undesirable adjacent channel or frequency may be received by the receiver.

SUMMARY OF THE INVENTION

The present invention relates to an automatic frequency control circuit for locking a tuning frequency at a proper frequency. The automatic frequency control circuit of this invention further comprises a defeating circuit in addition to conventional circuit components that are used for an automatic frequency controlling operation. The defeating circuit acts to defeat the operation of the automatic frequency control circuit for a predetermined time period just after the power switch of the receiver is turned.

It is an object of this invention to provide an automatic frequency control circuit for an electronic tuning circuit.

Another object of this invention is to provide an automatic frequency control circuit comprising a defeating circuit for avoiding a mis-operation of the tuning circuit.

Still another object of this invention is to provide an automatic frequency control circuit having a differential output type element for producing differential control voltages.

Yet, another object of this invention is to provide a defeating circuit constructed of a field effect transistor for use with an AFC circuit.

Other objects, features and advantages of this invention will be apparent from the following description taken in conjunction with the accompanying drawings.

DESCRIPTION OF THE PREFERRED EMBODIMENTS

For a better understanding of the present invention, a prior art receiver having an electronic turning circuit will be now described with reference to FIGS. 1 and 2.

In a television receiver, for example, there is provided an automatic frequency control circuit (which will be hereinafter referred to as an AFC circuit) so as to avoid drift of a local oscillating frequency which may be caused by temperature change and so on. An example of such an AFC circuit used in the prior art is shown in FIG. 1.

Figures 1, 2:
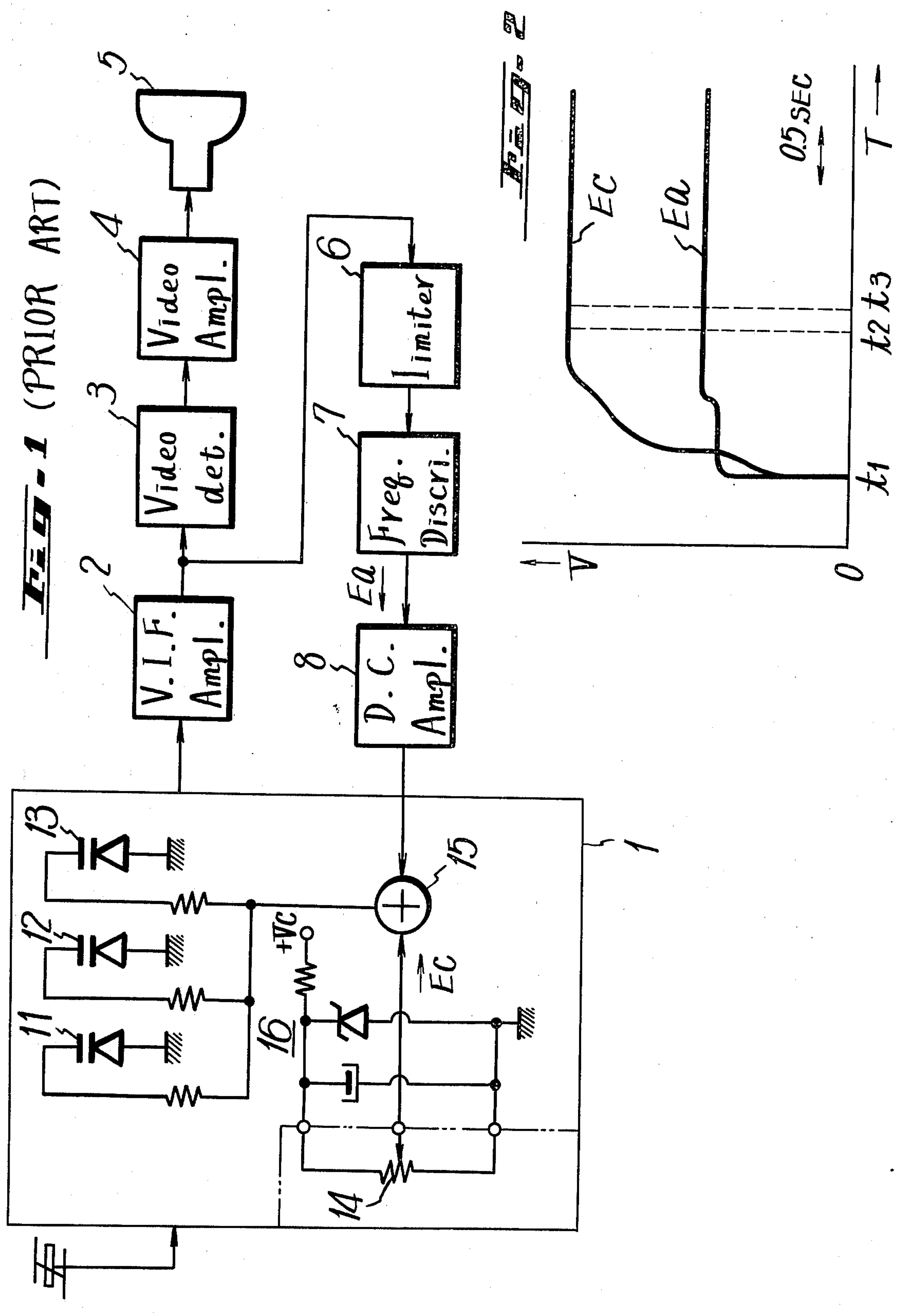
FIG. 1 (PRIOR ART), FIG. 2
FIG. 1 shows a prior art receiver having an electronic tuning circuit.
FIG. 2 shows a waveform chart for explaining the operation of the tuning receiver shown in FIG. 1.

In FIG. 1, reference numeral 1 generally designates a tuner of an electronic tuning type which includes an antenna tuning circuit, an inter-stage tuning circuit, a local oscillating circuit consisting of variable capacitance diodes 11, 12 and 13, and also a variable resistor 14 for channel selection. In a practical example, a plurality of variable resistors 14 are mounted on a tuner shaft in a turret type and are exchanged one by one at every time when a channel selection is carried out. A predetermined voltage $E_c$ obtained from the variable resistor 14 is applied through an adding circuit 15 to the diodes 11 to 13, respectively, as a tuning voltage (channel selecting voltage) to vary the capacitance of diodes 11 to 13 at the time when the variable resistor 14 is changed. Thus, the voltage $E_c$ is varied to carry out the channel selection.

A video intermediate frequency signal (which will be hereinafter referred to as a VIF signal) from the tuner 1 is fed through a video intermediate frequency amplifier (which will be hereinafter referred to as a VIF amplifier) 2 to video detector 3 the detected output from which is applied through a video amplifier 4 to a cathode ray tube 5. The VIF signal from the VIF amplifier 2 is also applied through a limiter 6 to a frequency discriminating circuit 7 which then produces an AFC voltage (DC voltage) $E_a$ which is changed in level as an S-shaped configuration in accordance with the frequency of the VIF signal. The AFC voltage $E_a$ is fed through a DC amplifier 8 and the adding circuit 15 to the diodes 11 to 13, respectively. As a result, when the local oscillating frequency drifts because of temperature change and so on and hence the frequency of the VIF signal drifts, the AFC voltage $E_a$ is changed to vary the capacitance of diodes 11 to 13 to make the frequency of the video carrier signal correct.

With the above mentioned electronic tuning type tuner 1, if the tuner 1 is a UHF tuner when electric power is applied to the television receiver at a time $t_1$ (shown in FIG. 2 in which the abscissa represents time T and the ordinate voltage V), the AFC voltage $E_a$ (which is the output of amplifier 8 and shifted in DC level) rises up abruptly. Thus, in the case where voltage $E_c$ for channel selection rises up gradually, the possibility exists that an error operation might obtain. That is, when the AFC voltage $E_a$ rises up abruptly at the time $t_1$, the AFC circuit itself is made substantially operable at the time $t_1$. If the voltage $E_c$ for channel selection rises up sufficiently at a time $t_2$, then during the time interval between the times $t_1$ and $t_2$ the capacitance of diodes 11 to 13 decreases gradually, because the voltage $E_c$ for channel selection is changed during this time interval. Thus, during this time interval, the receiving frequency of tuner 1 is swept from low frequency to high frequency sequentially and at the time $t_2$ the receiving frequency tends to be the desired one. In other words, when the power is supplied, the AFC circuit is first operated and the receiving frequency of tuner 1 swept to the desired one.

The channel selecting voltage $E_c$ rises slowly because of a time constant circuit 16 that is provided in connection with a power source $+V_c$ as illustrated, which time constant circuit avoids the variation of channel selecting voltage $E_c$.

When the AFC circuit is operated and the receiving frequency is swept, if another broadcasting signal is transmitted in a channel near and below the desired channel, for example, if the channel 46 is the desired channel and the UHF channel 44 is used for another broadcast transmission, the tuner 1 receives the UHF channel 44 once during the time when the swept receiving frequency coincides with that of UHF channel 44. When the signal of UHF channel 44 is received once, even if the channel selecting voltage $E_c$ increases further to a voltage corresponding to the UHF channel 46 and then the capacitance diodes 11, 12, 13 is varied to vary the local oscillating frequency, the AFC circuit is operated in a manner similar to that mentioned above to suppress this variation of the local oscillating frequency. As a result, the receiving frequency remains as that of the UHF channel 44 and hence the UHF channel 44 which is different from the desired one is received.

In order to avoid such an error operation, it is sufficient to narrow the pull-in range of the AFC, but this causes the lock-in range of the AFC to be narrowed to the point which may make the AFC operation inoperable.

An embodiment of the present invention which is free from the above defect of the prior art will be now described with reference to FIG. 3 in which the same reference numerals as those used in FIG. 1 indicate the same components.

Figures 3, 4:
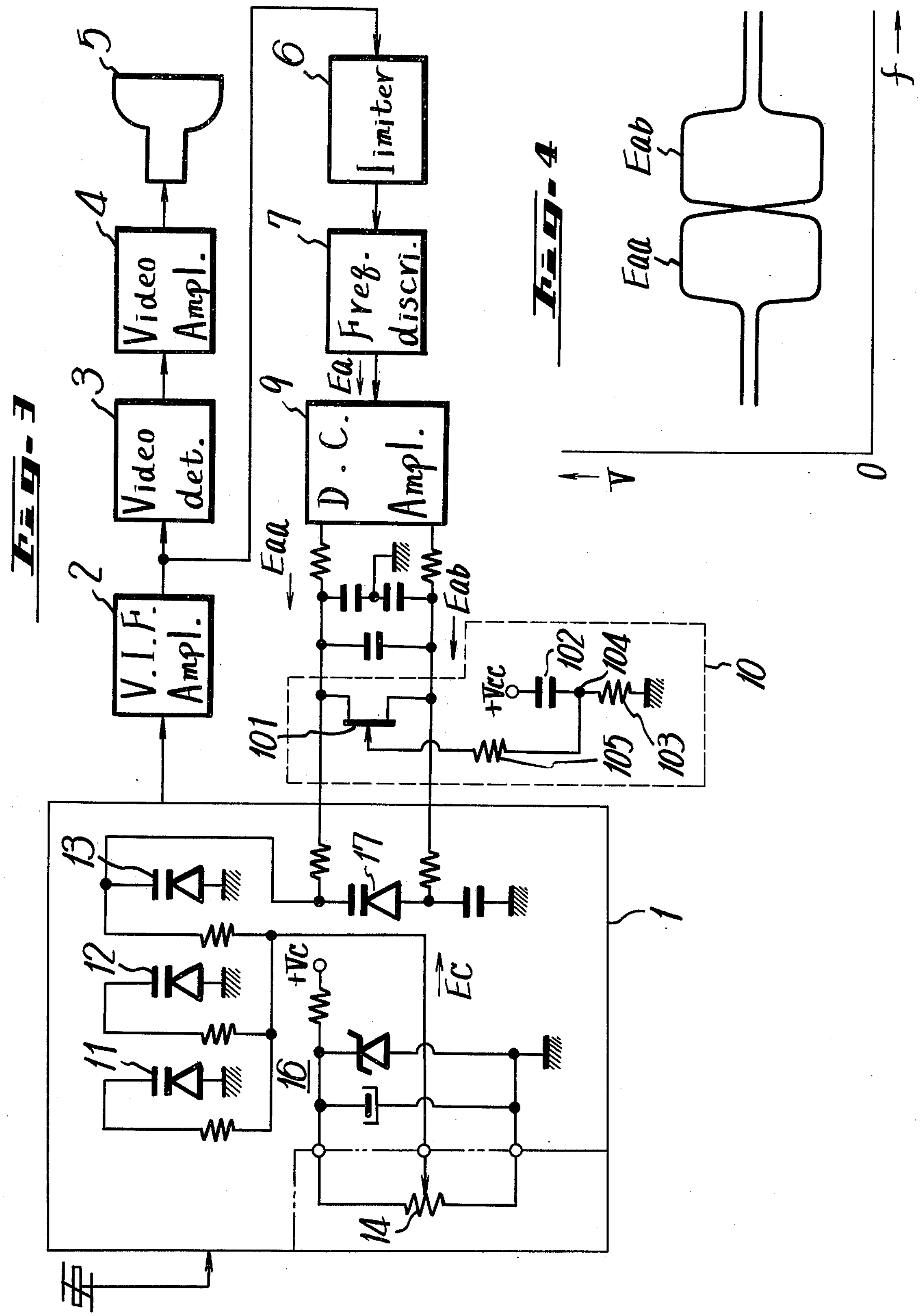
FIG. 3 shows a receiver having an electronic tuning circuit according to this invention.
FIG. 4 shows a waveform chart for explaining the operation of the receiver shown in FIG. 3.

In the embodiment shown in FIG. 3, a variable capacitance diode 17 is provided in the tuner 1 for only the AFC operation and a DC amplifier 9 of a differential output type is provided in place of the DC amplifier 8 in the prior art shown in FIG. 1.

AFC voltages $E_{aa}$ and $E_{ab}$ are produced from the DC amplifier 9 which have a predetermined DC level and change in opposite directions with each other in response to a frequency change as shown in FIG. 4 in which the abscissa represents the frequency $f$ and the ordinate the voltage V. The AFC voltages $E_{aa}$ and $E_{ab}$ are supplied across the diode 17 provided in the tuner 1.

In the embodiment of FIG. 3, there is provided a defeating circuit 10. That is, in a signal path for the AFC voltages $E_{aa}$ and $E_{ab}$ between the DC amplifier 9 and the tuner 1, there is provided a Field Effect Transistor (FET) 101 in such a manner that its source and drain electrodes are connected to the signal paths of AFC and voltages $E_{aa}$ and $E_{ab}$. A series connection of a capacitor 102 and a resistor 103 is connected between a point whereat a DC voltage rises up quickly as compared with the AFC voltages $E_{aa}$ and $E_{ab}$ and a reference point, for example, between an operation voltage source $+V_{cc}$ and ground. The connection point 104 between the capacitor 102 and resistor 103 is connected to the gate electrode of FET 101 through a resistor 105.

With the embodiment of the invention constructed as above, when the power is supplied at the time $t_1$ (refer to FIG. 2), DC voltage is immediately obtained from the voltage source $+V_{cc}$, so that the voltage at the connection point 104 increases at the time $t_1$ to make the FET 101 conductive. Accordingly, even if the AFC voltage $E_a$ or $E_{aa}$ $E_{ab}$ are obtained at the time $t_1$, they are cancelled with respect to each other because of the conductive path through the FET 101 and hence the AFC voltages $E_{aa}$ and $E_{ab}$ are not applied to the tuner 1.

During the time interval after power is first supplied, the capacitor 102 is charged by the current flowing through the resistor 103, so that if the capacitor 102 and resistor 103 are suitably selected in value, the charging up of capacitor 102 is completed at a time $t_3$ (refer to FIG. 2) when the channel selecting voltage $E_c$ rises up sufficiently, and hence the voltage at the connection point 104 is lowered to make the FET 101 nonconductive. Accordingly, after the time $t_3$, the AFC voltages $E_{aa}$ and $E_{ab}$ are applied to the tuner 1 from the DC amplifier 9. Since the channel selecting voltage $E_c$ has already risen up sufficiently at the time $t_3$, the reception of another channel as in the case of the prior art shown in FIG. 1 is avoided. Thus, the desired channel can be received without failure.

As mentioned above, with the present invention an error operation when power is first supplied is positively avoided by a simple construction.

Further, since the AFC voltages $E_{aa}$ and $E_{ab}$ which are changed in opposite directions are cancelled with respect to each other by the FET 101 to defeat the AFC operation, the average DC level of AFC voltages $E_{aa}$ and $E_{ac}$ is prevented from being changed and hence the AFC operation is stably initiated at the time $t_3$.

In the present invention, the FET 101 is used as a switching element, so that even if the AFC voltages $E_{aa}$ and $E_{ab}$ from the DC amplifier 9 change at all, the FET 101 can nevertheless be made conductive by applying to the gate electrode of FET 101 a voltage higher than the average DC voltage of AFC voltages $E_{aa}$ and $E_{ab}$ from the DC amplifier 9, which is attributable to the fact that the FET 101 is a bi-directional element.

Further, in the present invention, the gate electrode of FET 101 is coupled to ground through the resistor 103, so that the gate voltage of FET 101 is made substantially zero after the time $t_3$ and hence the FET 101 is sufficiently reversed biased to avoid being made conductive erroneously.

The above description is given on only one embodiment of the present invention, but it will be apparent that many modifications and variations could be effected by those skilled in the art without departing from the spirit and scope of novel concepts of the invention. Accordingly, the scope of the invention should be determined by the appended claims.

We claim as our invention:

1. An automatic frequency control circuit for tuning apparatus, the tuning apparatus having an electronically variable frequency generating means, and the automatic frequency control circuit being responsive to the output produced by a frequency discriminator supplied with IF signals, comprising:

a variable capacitance diode coupled to said variable frequency generating means, the frequency generated by said variable frequency generating means being a function of the capacitance value;

a differential output DC amplifier connected to said frequency discriminator and having first and second output terminals across which said variable capacitance diode is coupled, said differential output DC amplifier providing first and second voltages at said first and second output terminals, respectively, having substantially the same magnitude and opposite polarity in accordance with the frequency of the IF signals, said variable capacitance diode exhibiting a capacitance value determined by the difference between said first and second voltages;

a field effect transistor having source and drain electrodes interconnecting said first and second output terminals and a gate electrode for selectively receiving an energizing voltage to thereby render said field effect transistor conductive; and a voltage supply connected to said field effect transistor gate electrode for initially supplying said energizing voltage to said gate electrode when power is first supplied to said apparatus and for terminating said energizing voltage after a predetermined duration, said voltage supply comprising an R-C circuit connected across an operating voltage source, the junction defined by the series connected resistor and capacitor included in said R-C circuit being connected to said field effect transistor gate electrode, such that when said power is first supplied, the operating voltage provided by said operating voltage source is applied to said junction through said capacitor, the junction voltage decreasing as said capacitor is charged.

* * * * *